(12) United States Patent
Kim et al.

(10) Patent No.: US 11,668,743 B2
(45) Date of Patent: Jun. 6, 2023

(54) SEMICONDUCTOR DEVICE DEFECT ANALYSIS METHOD

(71) Applicant: Samsung Electronics Co., Ltd., Suwon-si (KR)

(72) Inventors: Hakgyun Kim, Suwon-si (KR); Bumsuk Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 17/469,169

(22) Filed: Sep. 8, 2021

(65) Prior Publication Data

US 2022/0236314 A1   Jul. 28, 2022

(30) Foreign Application Priority Data

Jan. 26, 2021   (KR) .................. 10-2021-0011035

(51) Int. Cl.
*G01R 31/02*        (2006.01)
*G01R 31/26*        (2020.01)
(Continued)

(52) U.S. Cl.
CPC ..... *G01R 31/2642* (2013.01); *G01R 31/2648* (2013.01); *G01R 31/2831* (2013.01); *G01R 31/2884* (2013.01); *G01R 31/2886* (2013.01); *H01L 22/34* (2013.01); *H01L 2924/00* (2013.01); *H01L 2924/0002* (2013.01)

(58) Field of Classification Search
CPC ............ G01R 31/2642; G01R 31/2648; G01R 31/2884; G01R 31/31711; G01R 31/2879; G01R 31/31707; G01R 31/31712; G01R 31/2812; G01R 31/2886; G01R 31/2831;
(Continued)

(56) References Cited

U.S. PATENT DOCUMENTS 5,420,513 A   5/1995 Kimura
6,894,517 B2  5/2005 Kang et al.
(Continued)

FOREIGN PATENT DOCUMENTS

JP   H06-334015 A   12/1994
JP   H09-326429 A   12/1997
(Continued)

OTHER PUBLICATIONS

A. Kerber, et al., "Impact of Failure Criteria on the Reliability Prediction of CMOS Devices With Ultrathin Gate Oxides Based on Voltage Ramp Stress," IEEE Electron Device Letters, vol. 27, No. 7, Jul. 2006.

*Primary Examiner* — Raul J Rios Russo
(74) *Attorney, Agent, or Firm* — Harness, Dickey & Pierce, P.L.C.

(57) ABSTRACT

A method of analyzing defects in a semiconductor device includes: collecting current data by applying a test voltage to the semiconductor device; extracting data within a decrease range from the current data; dividing the current data into a first component value and a second component value using the current data and the data extracted from within the decrease range; calculating a first quality index from the first component value satisfying a first function; and calculating a second quality index from the second component value satisfying a second function that is different from the first function.

20 Claims, 11 Drawing Sheets

(51) Int. Cl.
*G01R 31/28* (2006.01)
*H01L 21/66* (2006.01)

(58) Field of Classification Search
CPC ......... H01L 2924/00; H01L 2924/0002; H01L 22/34
USPC ......... 324/71, 378, 403, 415, 425, 500, 537, 324/762.01
See application file for complete search history.

(56) References Cited

U.S. PATENT DOCUMENTS

| | | |
|---|---|---|
| 7,579,859 B2 | 8/2009 | Liao et al. |
| 9,026,981 B2 | 5/2015 | Li et al. |
| 9,287,185 B1 | 3/2016 | Bonilla et al. |
| 9,599,656 B2 | 3/2017 | Uppal et al. |
| 9,639,645 B2 | 5/2017 | Bickford et al. |
| 2006/0114014 A1* | 6/2006 | Lam .......................... G06F 1/08 455/67.11 |
| 2006/0115910 A1 | 6/2006 | Okada |
| 2016/0377672 A1* | 12/2016 | Jenkins .............. G01R 31/2884 324/762.01 |
| 2019/0146028 A1* | 5/2019 | Subbareddy ..... G01R 31/31725 324/750.3 |

FOREIGN PATENT DOCUMENTS

| | | | |
|---|---|---|---|
| JP | 2003-332399 A | 11/2003 | |
| JP | 4623807 B2 | 2/2011 | |

* cited by examiner

| | CHARACTERISTIC VALUE | | | | | |
|---|---|---|---|---|---|---|
| FIRST GROUP | 0.7 | 1 | 1.2 | 1.5 | 2 | ④ |
| SECOND GROUP | 3 | 5 | 6 | 7 | 8 | 10 |
| REMARK | MINIMUM VALUE | | | | | MAXIMUM VALUE |

④ → BECOME QUALIFIED FOR MOVE

SEMICONDUCTOR DEVICE DEFECT ANALYSIS METHOD

CROSS-REFERENCE TO RELATED APPLICATION

This application is based on and claims priority under 35 U.S.C. § 119 to Korean Patent Application No. 10-2021-0011035, filed on Jan. 26, 2021, in the Korean Intellectual Property Office, the disclosure of which is incorporated by reference herein in its entirety.

BACKGROUND

The inventive concepts relate to a method of analyzing defects in a semiconductor device, and more particularly, a method of analyzing defects in a semiconductor device by using quality indexes.

When a low voltage is applied continuously to a semiconductor device, a gate dialectic (e.g., a gate oxide) may deteriorate and be destroyed eventually. A defect in a semiconductor caused by such phenomenon is referred to as a time dependent dielectric breakdown (TDDB), and as TDDB defects may result in the generation of leakage current passing through a gate dielectric and/or oxide, the semiconductor device may not be turned off normally. Such TDDB defect may occur, not only at the manufacturing stage, but while being used by users, and therefore needs to be detected before shipping the semiconductor products.

SUMMARY

The inventive concepts provide a method of analyzing defects in a semiconductor device by dividing current data components according to application of voltage.

The inventive concepts also provide a method of analyzing defects in a semiconductor device by grouping data according to a time required to reach a breakdown voltage and then redistributing the data.

According to an aspect of the inventive concepts, there is provided a method of analyzing defects in a semiconductor device, the method including: collecting current data by applying a test voltage to a semiconductor device; extracting data within a decrease range from the current data; dividing the current data into a first component value and a second component value using the current data and the data extract from within the decrease range; calculating a first quality index from the first component value satisfying a first function; and calculating a second quality index from the second component value satisfying a second function that is different from the first function.

According to another aspect of the inventive concepts, there is provided a method of analyzing defects in a semiconductor device, the method including: collecting current data by applying a test voltage to the plurality of semiconductor devices, the current data including voltage data and time data based on a breakdown voltage of the plurality of semiconductor devices; dividing the time data into multiple groups; matching a probability distribution to a distribution of each of the plurality of groups; and redistributing the time data of the groups based on the current data.

According to another aspect of the inventive concepts, there is provided a method of analyzing defects in a semiconductor device, the method including: collecting current data by applying a test voltage to a plurality of test element groups (TEGs), the current data including a voltage data and time data concerning a time based on a breakdown voltage of the TEGs; dividing the current data into a first component value and a second component value using the current data of each TEG and a decrease range of the current data of each TEG; calculating a first quality index from the first component value satisfying a first function; calculating a second quality index from the second component value satisfying a second function that is different from the first function; dividing the time data into a plurality of groups and matching a Weibull distribution to distributions of respective groups of the plurality of groups; calculating characteristic values of the respective groups using the first quality index and the second quality index; redistributing the time data using the characteristic values; matching a Weibull distribution to each distribution of the redistributed time data, and calculating a likelihood; and storing redistribution results of the time data and the likelihood.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EXAMPLE EMBODIMENTS

A semiconductor device, to which a test voltage is applied, may include a test device which is formed on a wafer to test quality of the semiconductor device during the semiconductor production process. The test device may be formed on a scribe line, and/or a plurality of test devices may be formed on one wafer. Such test device may be referred to as a "test element group" (TEG). From the TEG, time data and current data may be generated. For example, the TEG may include a substrate, a gate dielectric (e.g., an insulating gate oxide) on the substrate, and a gate (e.g., an electrode) on the gate dielectric. The life of the gate dielectric may be measured by applying a stress voltage to the gate, and then measuring a current flowing at the gate. Current data corresponding to a TEG may refer to gate current values which may vary according to a plurality of stress voltages applied to the TEG. Time data corresponding to a TEG may refer to a "time required to reach a breakdown voltage" calculated by applying a plurality of stress voltages to the TEG. The breakdown voltage may refer to a voltage at which the gate dielectric is destroyed, causing an abrupt and rapid current flow (e.g., through the gate dielectric). Hereinafter, the inventive concepts are explained based on the time data and current data generated from the TEG; however, the inventive concepts are not limited thereto.

Figure 1:
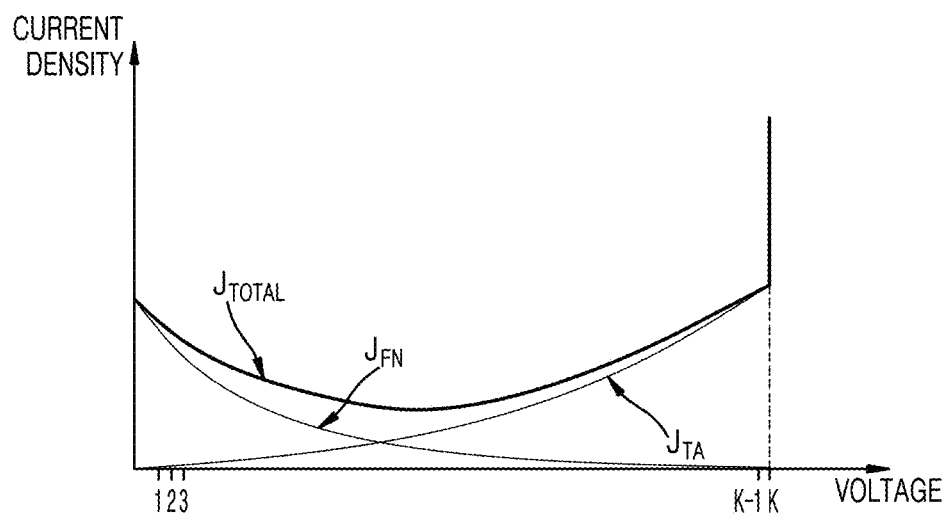
FIG. 1 is a graph showing currents and components thereof which are output in accordance with a voltage applied to a semiconductor device according to some example embodiments.
Figure 2:
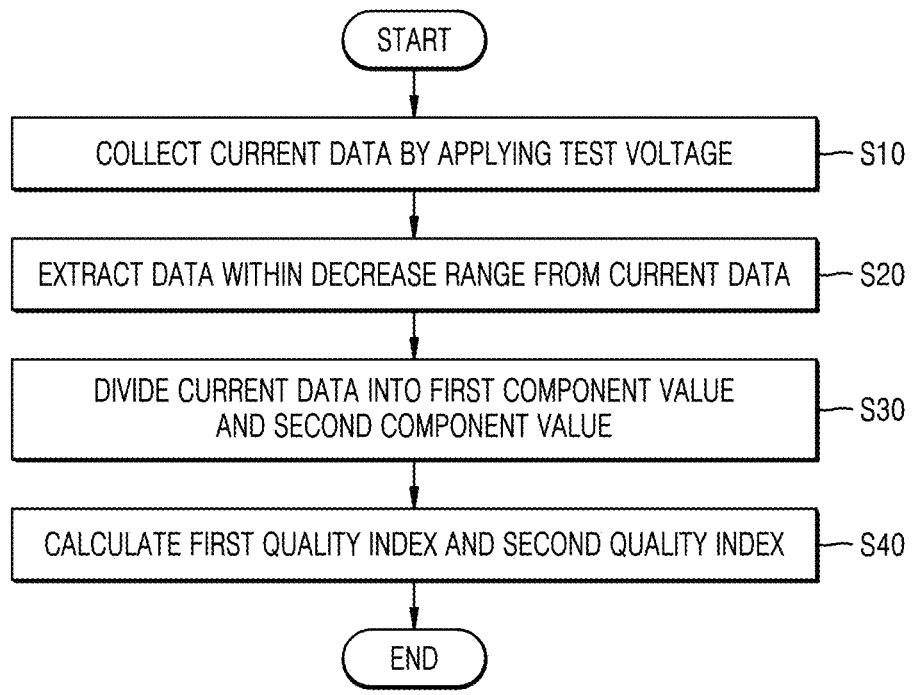
FIGS. 2 and 3 are flowcharts of a method of analyzing defects in a semiconductor device, according to some example embodiments.
Figure 3:
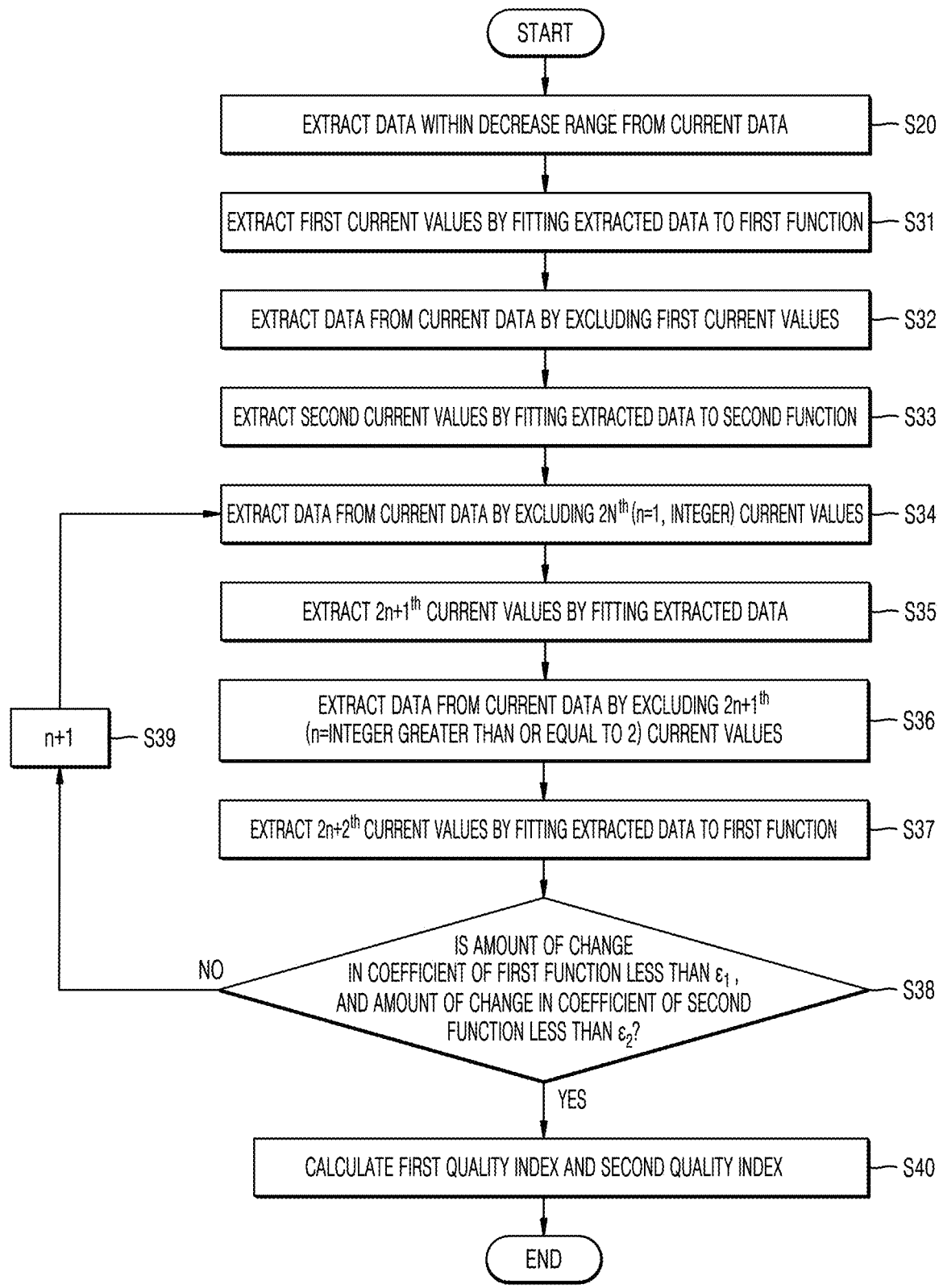

FIG. 1 is a graph showing current data output according to a voltage applied to a semiconductor device along with a first component and a second component of the current data. FIG. 2 is a flowchart of a method of analyzing defects in a semiconductor device, according to some example embodiments. FIG. 3 is a flowchart showing detailed operations of operation S30 of FIG. 2. FIGS. 4 to 12 are graphs showing currents output in accordance with a voltage applied to a semiconductor device according to FIGS. 2 and 3. To facilitate a better understanding of the flowcharts of a method of analyzing defects in a semiconductor device of FIGS. 2 to 3, FIGS. 4 to 12 will be described in company with the aforementioned drawings.

With reference to FIG. 1, the current data $J_{TOTAL}$ according to a test voltage may decrease before increasing. The test voltage may refer to a plurality of stress voltages, for example, as described above. The stress voltages may include K voltage levels (wherein K is a natural number greater than or equal to 1). The stress voltages may increase regularly until they reach a breakdown voltage. Thus, the $K^{th}$ stress voltage may be the breakdown voltage. The current data $J_{TOTAL}$ may include current values according to the stress voltages.

The current data $J_{TOTAL}$ may be divided into a first component value $J_{FN}$ and a second component value $J_{TA}$. The current data $J_{TOTAL}$ may be changed based the first component value $J_{FN}$ and the second component value $J_{TA}$. In some embodiments, the first component value $J_{FN}$ may represent a current change by Fowler Nordheim Tunneling (FN tunneling), and the second component value $J_{TA}$ may represent a current change by trap assisted tunneling (TA tunneling). The current data $J_{TOTAL}$ may be an aggregation of the first component value $J_{FN}$ and the second component value $J_{TA}$. Thus, the current data $J_{TOTAL}$ may be represented by the following Equation 1.

$$J_{TOTAL} = J_{FN} + J_{TA} \quad \text{[Equation 1]}$$

According to Equation 1, the second component value $J_{TA}$ may be extracted by excluding the first component value $J_{FN}$ from the current data $J_{TOTAL}$, and the first component value $J_{FN}$ may be extracted by excluding the second component value $J_{TA}$ from the current data $J_{TOTAL}$. Hereinafter, FIGS. 2 to 3 will be explained based on the above description.

With reference to FIG. 2, a first quality index and a second quality index may be calculated by dividing the current data according to the test voltage into the first component value and the second component value.

In operation S10, current data (e.g., the current data $J_{TOTAL}$ of FIG. 1) may be collected by applying the test voltage to a semiconductor device. The semiconductor device may include a TEG.

In operation S20, data within a decrease range may be extracted from the current data. The data within a decrease range may include current values that decrease as the stress voltage increases.

In operation S30, by using the current data and the data within the decrease range, the current data may be divided into the first component value and the second component value. The first component value may be separated by using a first function, and the second component value may be separated by using a second function. The first function and the second function may be different from each other.

In operation S40, a first quality index may be calculated by using the first component value satisfying the first function. A second quality index may be calculated by using the second component value satisfying the second function. The first quality index and the second quality index each may represent the quality of the gate dielectric.

FIG. 3 is a flowchart showing detailed operations of operation S30 of FIG. 2. Therefore, operation S10 of FIG. 2 is omitted in FIG. 3; however, operation S10 of FIG. 2 may be followed by operation S20 of FIG. 3.

Figure 4:
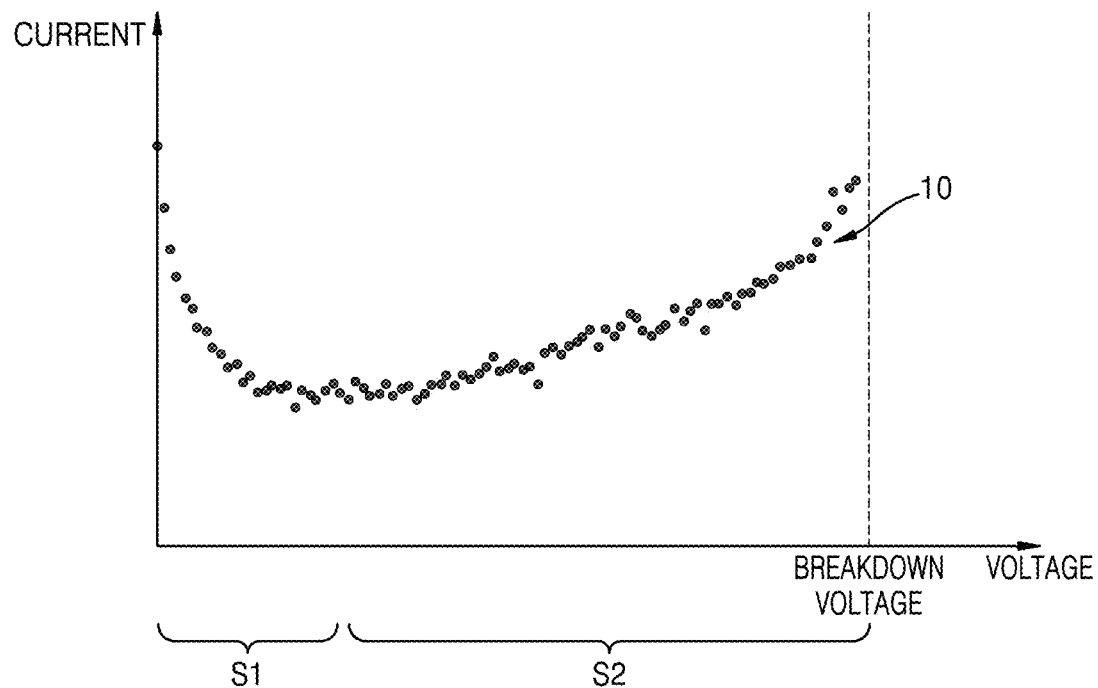
FIGS. 4 to 12 are graphs showing currents output in accordance with a voltage applied to a semiconductor device according to FIG. 2.
Figure 5:
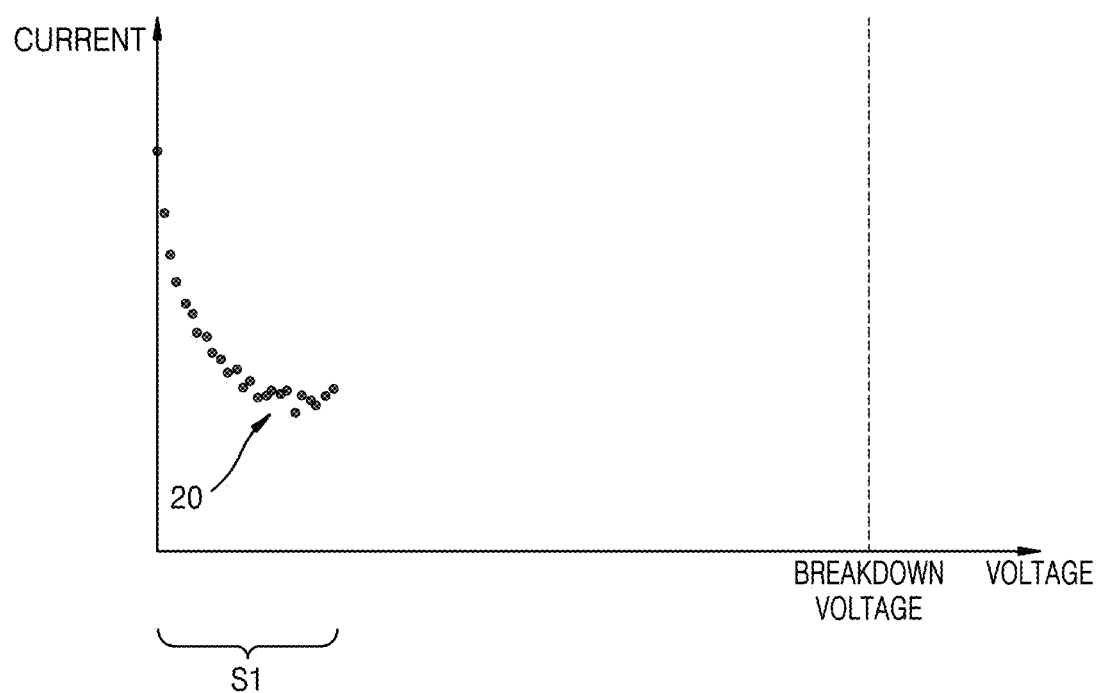

With reference to FIGS. 3 to 5, the data within a decrease range may be extracted from current data in operation S20. The current data may include the current data 10 of FIG. 4.

With reference to FIG. 4, the current data 10 may be collected by operation S10 of FIG. 2. The current data 10 may increase after decreasing when a voltage applied to the gate increases. A range where the current data 10 decreases may be referred to as a decrease range S1, and a range where the current data 10 increases may be referred to as an increase range S2. In the decrease range S1 of the current data 10, as the stress voltages are applied, raising an energy barrier of the gate dielectric, the current flowing in the gate may be reduced. Effects caused by FN tunneling may be relatively significant in the decrease range S1 of the current data 10. In the increase range S2 of the current data 10, as the stress voltages are applied, forming traps in the gate dielectric, the current flowing in the gate may be increased. In the increase range S2 of the current data 10, as the traps are formed in the gate dielectric, effects caused by TA tunneling may be relatively significant. The current data 10 may be divided into the first component value and the second component value as shown in FIG. 1. The current data 10 may be divided into components by FA tunneling and components by TA tunneling.

With reference to FIG. 5, the data 20 within the decrease range S1 may be extracted from the current data 10 in operation S20 of FIG. 3. The data 20 within the decrease range S1 may represent the effects on the current data 10 caused by FN tunneling.

Figure 6:
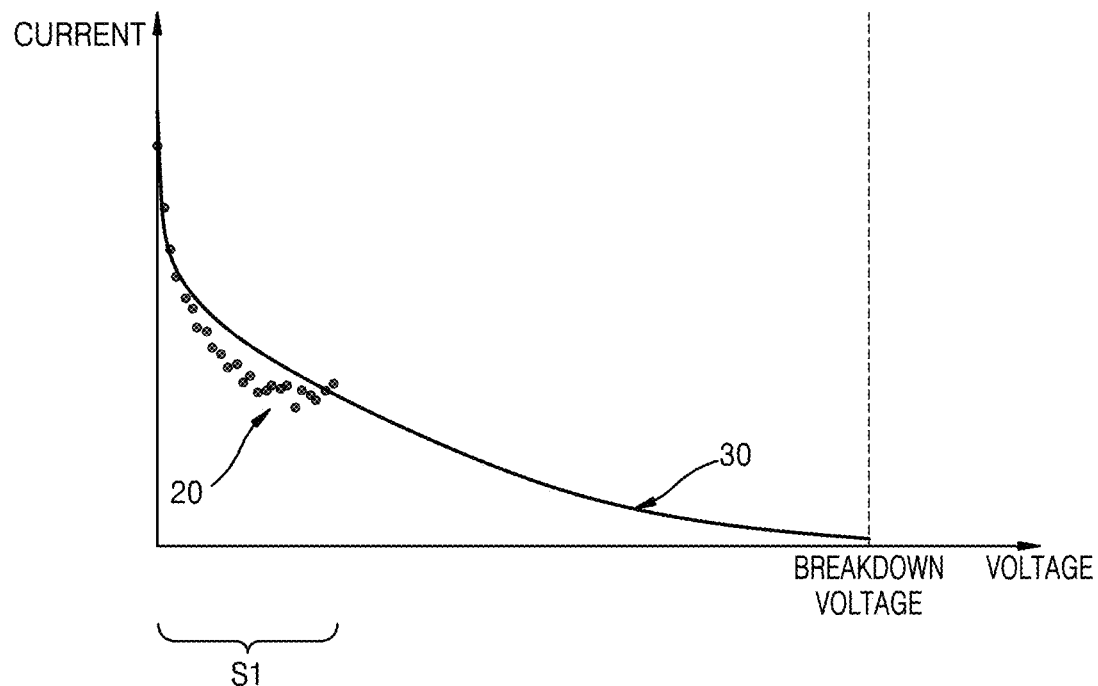

With reference to FIGS. 3 and 6, in operation S31, first current values 30 may be extracted by fitting the data 20 of the decrease range S1 to the first function. The first function may be a function concerning a rate of change in electric field ($\Delta E$), and representing changes in current values caused by FN tunneling. The first function may be expressed as the following Equation 2.

$$\Delta E = \frac{E_O + \ln\frac{J}{J_O}}{2 + \ln\frac{B}{E_O}} = a_1 \times t^{a_2} \quad \text{[Equation 2]}$$

In Equation 2, $\Delta E$ may represent the amount of change in the electric field, $E_o$ may represent an initial electric field value, $J_o$ may represent an initial current density, and $J$ may represent a current density after a stress voltage is applied. In Equation 2, B may represent a gate dielectric specific factor, and may refer to Equation 3.

$$B = \frac{4}{3} \times \frac{(2m_{ox})^{\frac{1}{2}}}{q\hbar(\Phi_b)^{\frac{3}{2}}} \quad \text{[Equation 3]}$$

In Equation 3, $m_{ox}$ may represent an effective mass of the dielectric, and q may represent an electric charge quantity. $\hbar$ may represent Planck's constant, and $\Phi_b$ may represent a height of an energy barrier.

The first current values 30 may be extracted by fitting the data 20 within the decrease range S1 to the first function. The first current values 30 may satisfy the first function and include information on sizes of the current that changes according to the stress voltages. For example, the first current values 30 may decrease when the stress voltage increases. The first current values 30 may represent current changes caused by FN tunneling. A coefficient $a_2$ of the first function may be extracted from the first function by fitting the data 20 within the decrease range S1 to the first function. The coefficient $a_2$ of the first function may become an index for determining whether the distribution of the $2n+1^{th}$ (wherein n is an integer greater than or equal to 1) current value is an optimized distribution in following operations.

Figure 7:
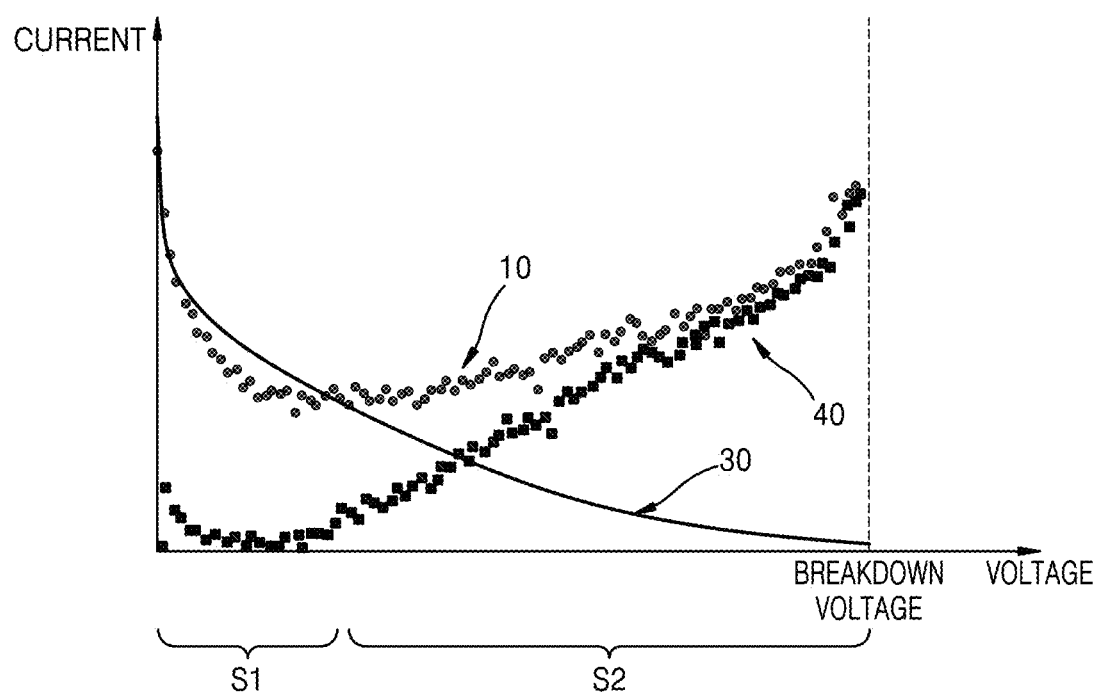

With reference to FIGS. 3 and 7, in operation S32, the data 40 within the increase range S2 may be extracted using the current data 10 and the first current values 30. The data 40 within the increase range S2 may be extracted by excluding the first current values 30 from the current data 10. The data 40 within the increase range S2 may represent the effects on the current data 10 caused by TA tunneling. With reference to the aforementioned Equation 1, as the total current may be the sum of the FN tunneling components and the TA tunneling components, the data 40 within the increase range S2, which represents the TA tunneling components, by excluding the first current values 30 representing the FN tunneling components from the current data 10.

Figure 8:
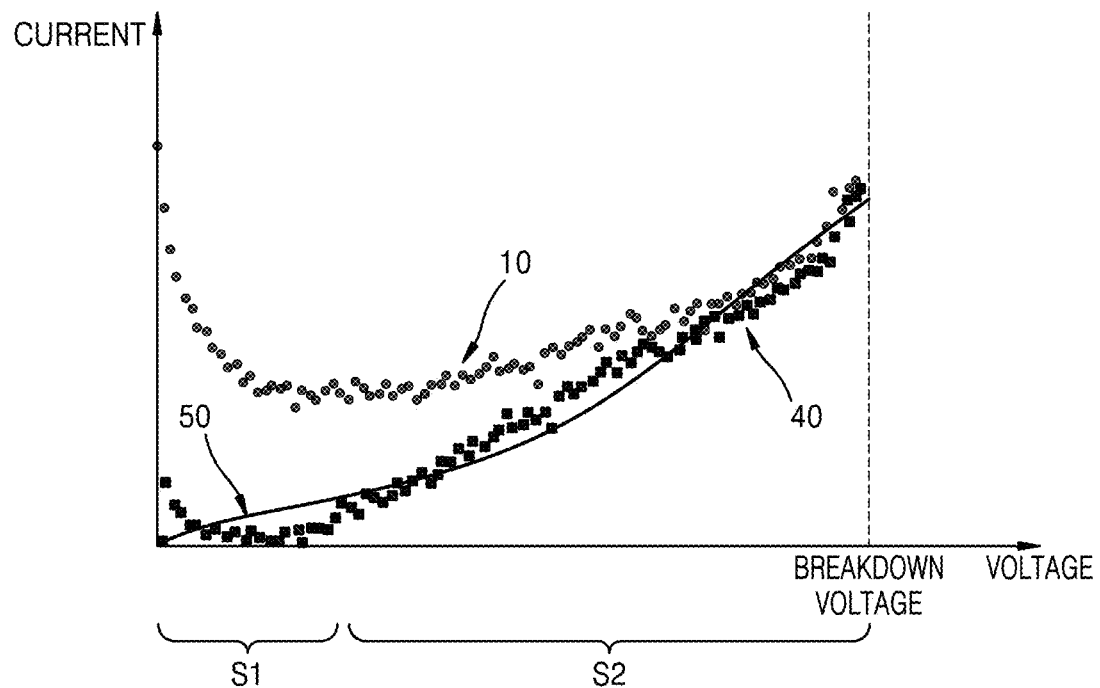

With reference to FIGS. 3 and 8, in operation S33, the data 40 within the increase range S2 may be fitted to the second function. The second function may be a function concerning a current density that changes according to a trap density $N_t$. The second function may be a function representing changes caused by TA tunneling. The second function may be expressed as Equation 4, and the trap density $N_t$ may be expressed as Equation 5.

$$J = \frac{2qC_t N_t \varphi_t \exp\left[\left(-\frac{D}{E}\right)\varphi_t^{\frac{3}{2}}\right]}{3E} \quad \text{[Equation 4]}$$

$$N_t = a_3 \times t^{a_4} \quad \text{[Equation 5]}$$

In Equation 4, E may represent an electric field value, $C_t$ may represent a trap energy dependent rate constant, and $N_t$ may represent a trap density. $\varphi_t$ may represent a trap energy level. In Equation 4, D may represent a charge quantity dependent factor, and/or may refer to Equation 6.

$$D = \frac{4 \times \sqrt{2qm_{ox}}}{3\hbar} \quad \text{[Equation 6]}$$

In Equation 6, q may represent an electric charge quantity, and $m_{ox}$ may represent an effective mass of the dielectric (e.g., the gate oxide). $\hbar$ may represent Planck's constant.

The second current values 50 may be extracted by fitting the data 40 within the increase range S2 to the second function. The second current values 50 may satisfy the second function and include information on sizes of the current that changes according to the stress voltages.

For example, the second current values 50 may increase when the stress voltage increases. The second current values 50 may represent current changes caused by TA tunneling. A coefficient $a_4$ of the second function may be extracted from the second function by fitting the data 40 within the increase range S2 to the second function. The coefficient $a_4$ of the second function may become an index for determining whether the distribution of the $2n+2^{th}$ (wherein n is an integer greater than or equal to 1) current value is an optimized distribution in following operations. The coefficient $a_4$ of the second function may be calculated by using Equation 4 and Equation 5.

Figure 9:
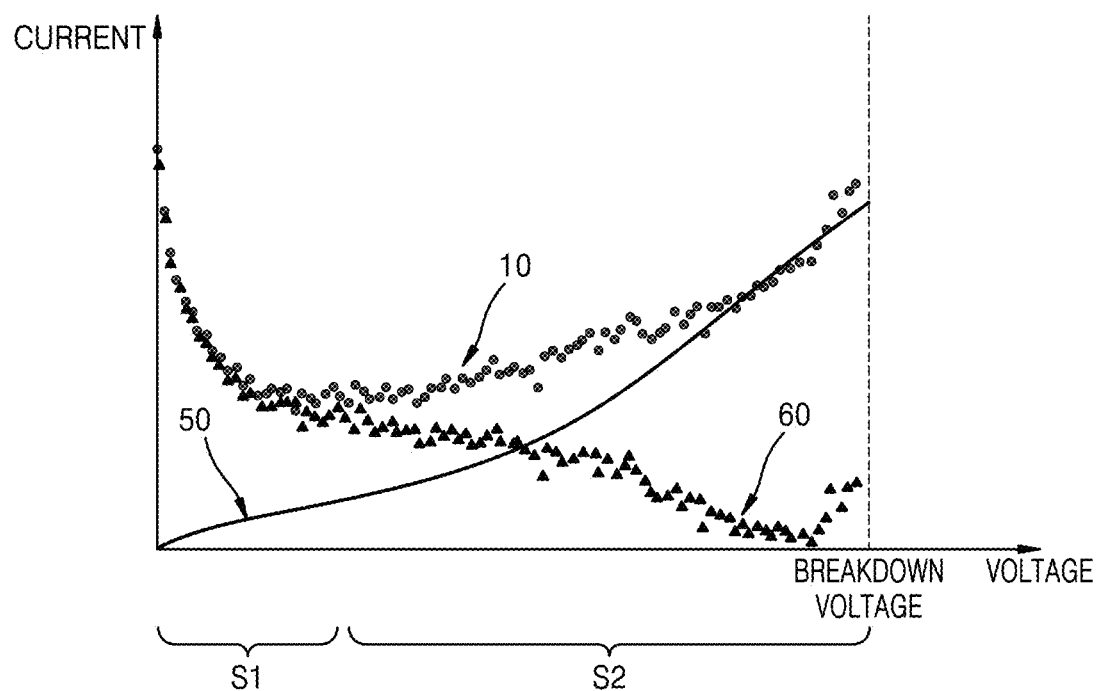

With reference to FIGS. 3 and 9, in operation S34, data which excludes $2n^{th}$ (n=1/integer greater than or equal to 2) current values 50 may be extracted from the current data 10. For example, the same (and/or substantially similar) way to obtain data 40 within the increase range S2 in operation S32 may be applied to S34 as well. As $2n^{th}$ (n=1/integer greater than or equal to 2) current values 50 may represent current changes caused by TA tunneling, by using the aforementioned Equation 1, data 60 representing the FN tunneling components may be extracted by excluding $2n^{th}$ (n=1/integer greater than or equal to 2) current values 50 from the current data 10.

Figure 10:
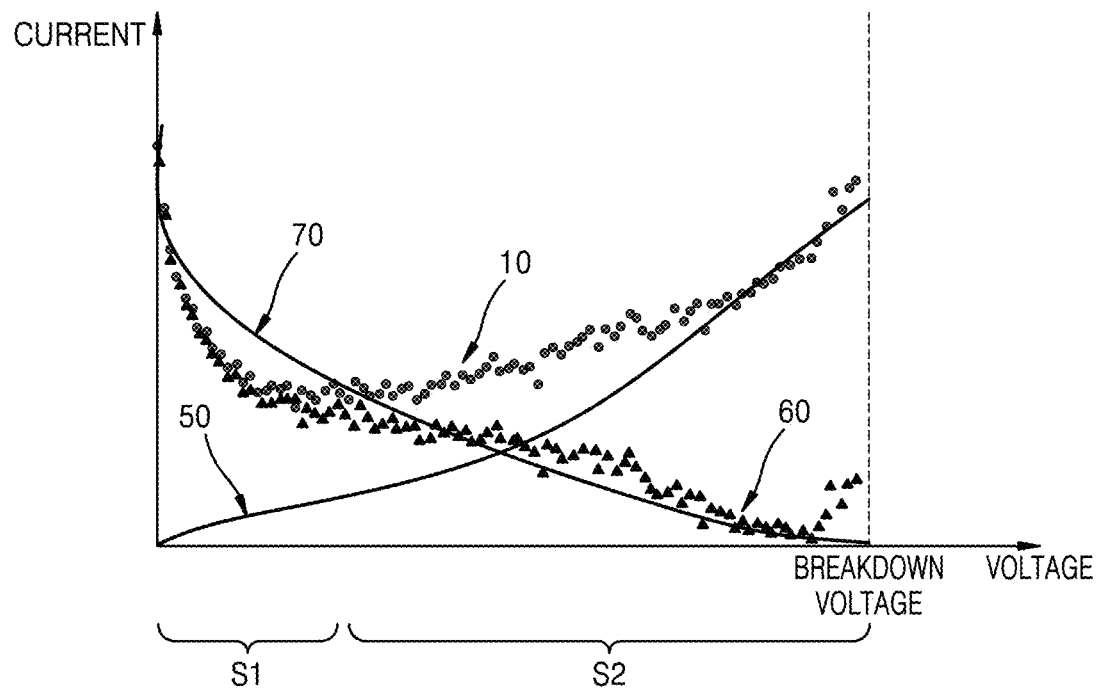

With reference to FIGS. 3 and 10, in operation S35, by fitting the data 60 extracted by excluding $2n^{th}$ (n=1/integer greater than or equal to 2) current values 50 from the current data 10 to the first function, $2n+1^{th}$ (n=1/integer greater than or equal to 2) current values 70 may be extracted. Operation S35 may be carried out in a similar way to operation S31. The first function may be expressed as Equation 2.

Figure 11:
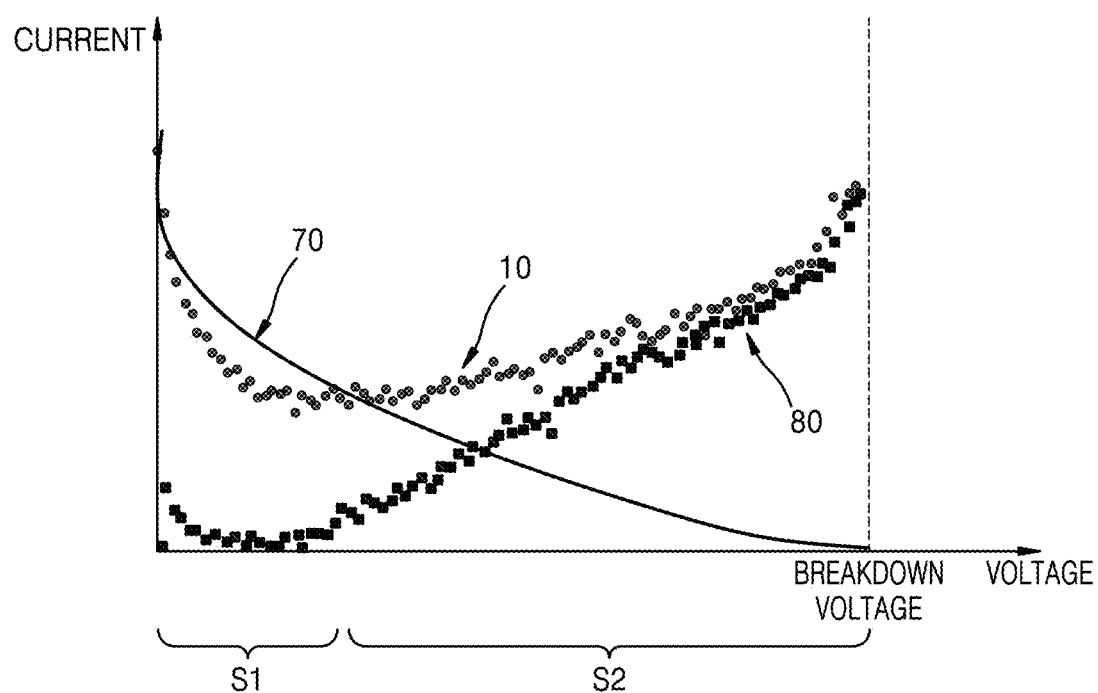

With reference to FIGS. 3 and 11, in operation S36, it may be extracted data which excludes $2n+1^{th}$ (n=1/integer greater than or equal to 2) current values 70 from the current data 10. The same (and/or substantially similar) way to obtain data 40 within the increase range S2 in operation S32 may be applied to S36 as well. As $2n+1^{th}$ (n=1/integer greater than or equal to 2) current values 70 may represent current changes caused by FN tunneling, by using the aforementioned Equation 1, $2n+2^{th}$ (n=1/integer greater than or equal to 2) data 80 representing the TA tunneling components may be extracted by excluding $2n+1^{th}$ (n=1/integer greater than or equal to 2) current values 70 from the current data 10.

Figure 12:
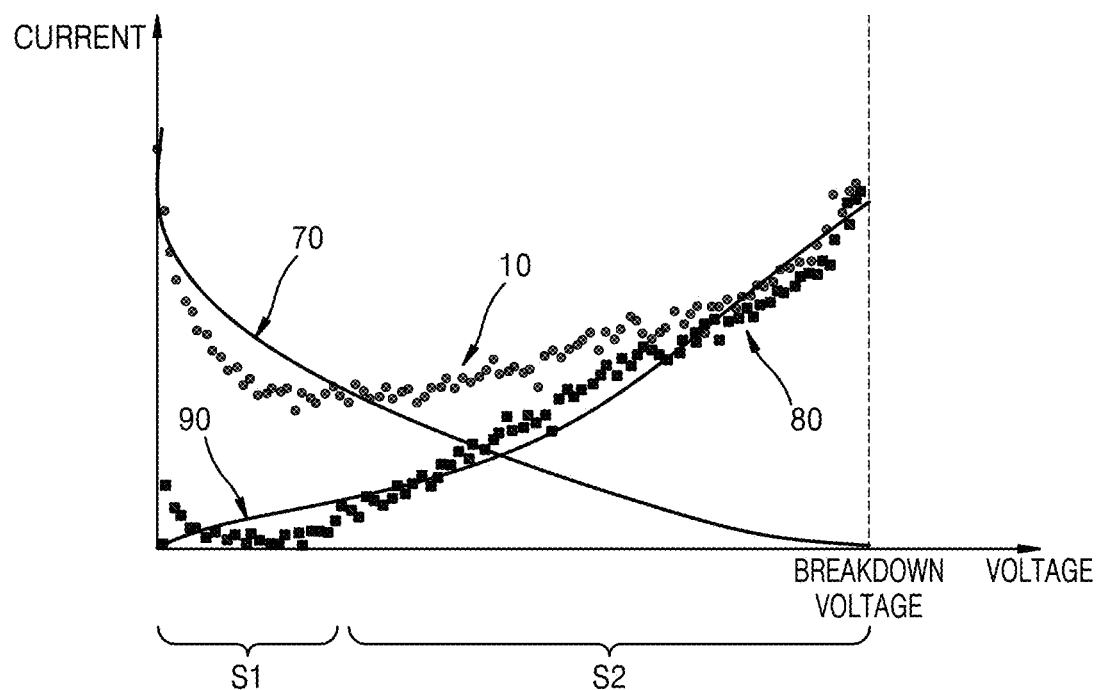

With reference to FIGS. 3 and 12, in operation S37, by fitting the data 80 extracted by excluding $2n+1^{th}$ (n=1/integer greater than or equal to 2) current values 50 from the current data 10 to the second function, $2n+2^{th}$ (n=1/integer greater than or equal to 2) current values 90 may be extracted. Operation S37 may be carried out in a similar way to operation S33. The first function may be expressed as Equation 2.

With reference to FIG. 3, an amount of change in the coefficient $a_2$ of the first function and an amount of change in the coefficient $a_4$ of the second function may be measured in operation S38. When n is 1, the amount of change in the coefficient of the first function may refer to a difference between a coefficient $a_{2\_1}$ extracted from the first function by fitting the data 20 within the decrease range S1 to the first function in operation S31, and a coefficient $a_{2\_2}$ extracted from the first function by fitting the third current values 70 to the first function in operation S35. When n is 1, the amount of change in the coefficient of the second function may refer to a difference between a coefficient $a_{4\_1}$ extracted from the second function by fitting the data 40 within the increase range S2 to the second function in operation S33, and a coefficient $a_{4\_2}$ extracted from the second function by fitting the fourth current values 80 to the second function in operation S37.

For example, the amount of change in the coefficient of the first function may refer to a difference between the coefficient $a_{2\_1}$ extracted from the first function by fitting $2n-1^{th}$ (n=1/integer greater than or equal to 1) current values to the first function, and the coefficient $a_{2\_2}$ extracted from the first function by fitting $2n+1^{th}$ current values to the first function, and the amount of change in the coefficient of the second function may refer to a difference between the coefficient $a_{4\_1}$ extracted from the second function by fitting $2n^{th}$ current values to the second function, and the coefficient $a_{4\_2}$ extracted from the second function by fitting $2n+2^{th}$ current values to the second function.

When the amount of change in the coefficient of the first function is less than a first constant $\varepsilon 1$, and the amount of change in the coefficient of the second function is less than a second constant $\varepsilon 2$, operation S40 is performed, and if not, operation S39 may be performed. Distributions in which the amount of change in the coefficients of each function is less than each constant may be understood as and/or referred to as optimized distributions.

The first constant $\varepsilon 1$ and the second constant $\varepsilon 2$ may represent arbitrary (or otherwise desired) constant values at which the fittings to each function are performed in a stable manner. For example, the first constant $\varepsilon 1$ may represent a fitting fidelity regarding the first function, and/or the second constant $\varepsilon 2$ may represent a fitting fidelity regarding the second function. When the first constant $\varepsilon 1$ and the second constant $\varepsilon 2$ are set to a great value, the fitting may be completed quickly allowing a higher productivity; however, fittings to each function may not be performed accurately. When the first constant $\varepsilon 1$ and the second constant $\varepsilon 2$ are set to a small value, fittings for each function may be performed accurately; however, the fittings for each function may take considerable time, which leads to a lower productivity. The first constant $\varepsilon 1$ and the second constant $\varepsilon 2$ may be set by a user. The first constant $\varepsilon 1$ and the second constant $\varepsilon 2$ may have the same or different values. For example, the $2n+1^{th}$ current value of which the amount of change in the coefficient of the first function is less than the first constant $\varepsilon 1$ may stably represent current changes caused by FN tunneling. Also, the $2n+2^{th}$ current value of which the amount of change in the coefficient of the second function is less than the second constant $\varepsilon 2$ may stably represent current changes caused by TA tunneling.

With reference to FIG. 3, when an amount of change in the coefficient of the first function is greater than the first constant $\varepsilon 1$ or an amount of change in the coefficient of the second function is greater than the second constant $\varepsilon 2$, operation S39 may be performed. In operation S39, n may be increased by 1. After operation S39 is performed, operations S34, S35, S36, S37 and S38 may be repeated until the conditions of operation S38 are satisfied.

When an amount of change in the coefficient of the first function is less than the first constant $\varepsilon 1$, and an amount of change in the coefficient of the second function is less than the second constant $\varepsilon 2$, operation S40 may be performed. The first component value $J_{FN}$ and the second component value $J_{TA}$ of FIG. 1 may be determined in operation S40. When the amount of change in the coefficient of the first function is less than the first constant $\varepsilon 1$, the first component value $J_{FN}$ may be determined as the $2n+1^{th}$ current value, and when the amount of change in the coefficient of the second function is less than the second constant $\varepsilon 2$, the second component value $J_{TA}$ may be determined as the $2n+2^{th}$ current value.

In operation S40, the first quality index and the second quality index may be calculated. The first quality index may be determined as the coefficient of the first function calculated according to the extraction of the $2n+1^{th}$ current values. The first quality index may be calculated from the first component value $J_{FN}$ satisfying the first function. The second quality index may be determined as the coefficient of the second function calculated according to the extraction of the $2n+2^{th}$ current values. The second quality index may be calculated from the second component value $J_{TA}$ satisfying the second function. The first quality index may be a factor representing the FN tunneling components of the current data in relation to the test voltage. The first quality index may be changed according to FN tunneling effects on the current data caused by the test voltage. The first quality index may be calculated from the equation concerning a rate of change in an electric field, and a high rate of change in an electric field may indicate that the reliability of a semiconductor device has been degraded. The second quality index may be a factor representing the TA tunneling components of the current data in relation to the test voltage. The second quality index may be changed according to TA tunneling effects on the current data caused by the test voltage. The second quality index may be calculated from the equation concerning a trap density, and a high trap density may indicate that the reliability of a semiconductor device has been degraded.

According to the inventive concepts, types of defects in a semiconductor device may be divided into categories by extracting quality indexes representing characteristics of the semiconductor device that implements current data according to a test voltage. By categorizing defects in a semiconductor device, they can be accurately predicted. Further, when a method of analyzing defects in a semiconductor device, according to the inventive concepts, is performed at a wafer level, the accuracy in cutting a wafer into each chip and/or packaging each chip may be improved. Accordingly, not only can defects in a semiconductor device may be detected early but also the reliability of the semiconductor device may be improved.

Figure 13:
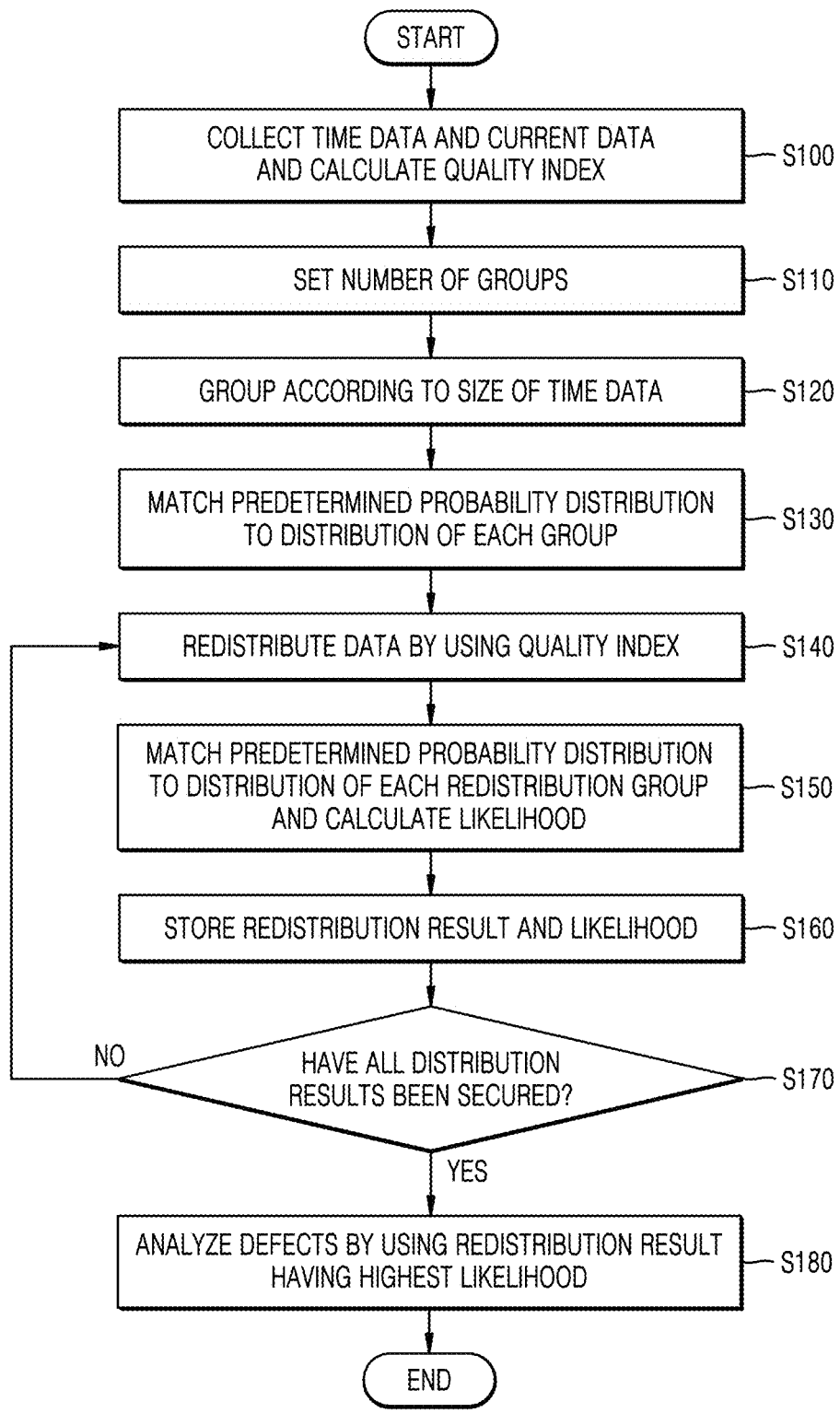
FIGS. 13 and 14 are flowcharts of a method of analyzing defects in a semiconductor device, according to some example embodiments.
Figure 14:
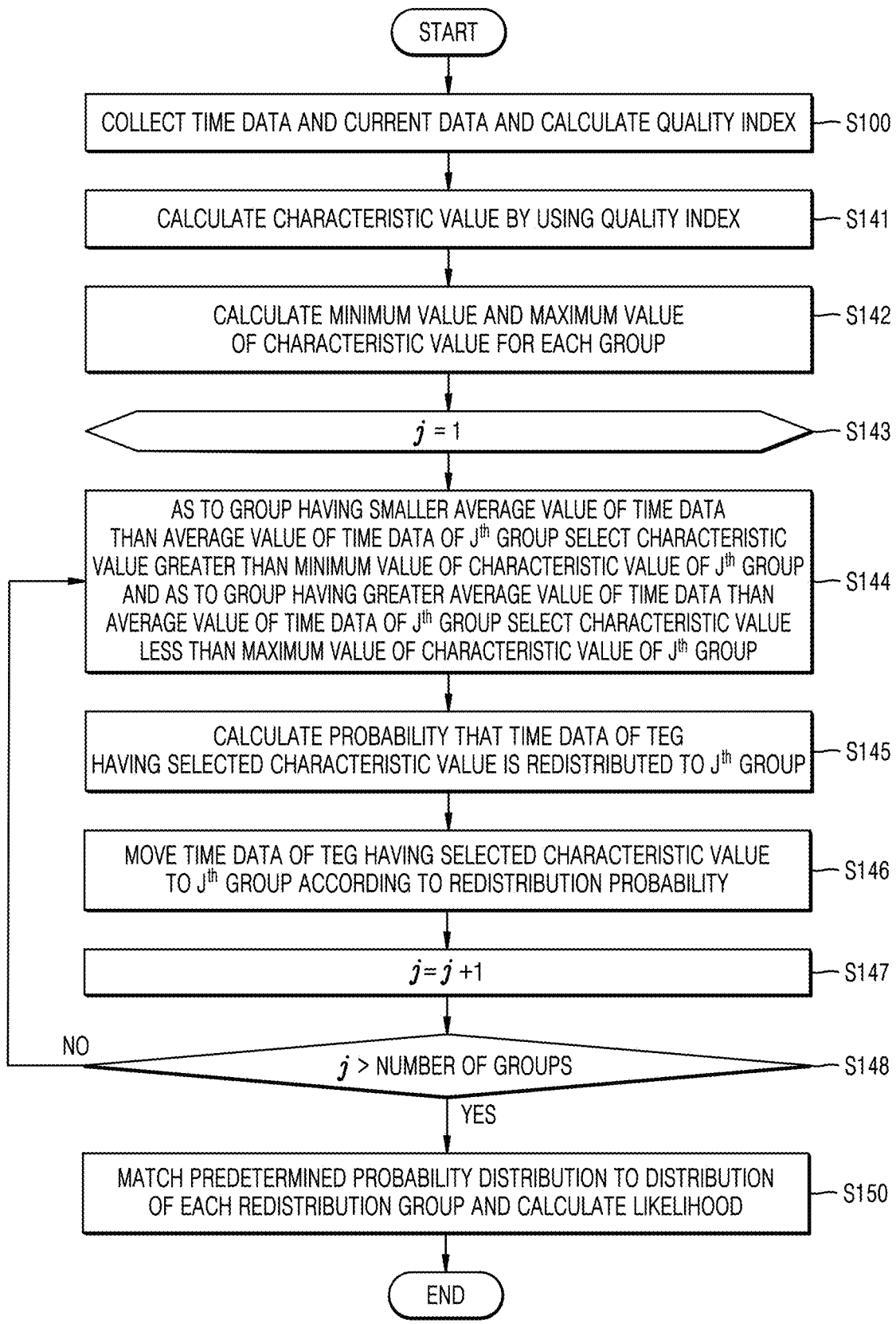

FIG. 13 is a flowchart illustrating a method of analyzing defects in a semiconductor device, according to an example embodiment, and FIG. 14 is a flowchart explaining the data redistribution by using quality indexes of FIG. 13. To facilitate a better understanding of the flowchart of a method of analyzing defects in a semiconductor device of FIG. 13, FIG. 14 will be described in company with FIG. 13.

With reference to FIG. 13, defects in a semiconductor device may be analyzed by using data obtained by applying a test voltage to the semiconductor device. The semiconductor device may include a TEG. In some embodiments, a test voltage may be applied to a plurality of TEGs to collect data.

In operation S100, by applying a test voltage to a plurality of TEGs, current data and time data concerning a time required to reach a breakdown voltage according to the test voltage may be obtained. The quality indexes may be calculated by using each time data. There may be one or more quality indexes. The quality index may be an element representing the quality of a semiconductor device. For example, the quality index may include an element representing the quality of a gate dielectric. The quality of the gate dielectric may be determined by calculating a value representing effects caused by FN tunneling or effects caused by TA tunneling. The quality index may be calculated by various methods. In some embodiments, the quality index may be calculated according to the methods of FIGS. 2 and 3, and may be, for example, the first quality index and the second quality index calculated in operation S40 of FIGS. 2 and 3.

In operation S110, the number of groups may be determined. The number of groups may be the number of groups of time data. The number of groups may be determined according to the number of types of defects in the semiconductor device. For example, when types of defects in a semiconductor device are categorized into initial failures, faulty abrasion, and robustness defects, the number of groups may be '3.' The number of groups may be set as an integer greater than or equal to 1. In some embodiments, the number of groups may be set by a user.

In operation S120, the time data may be grouped according to the number of the groups. The time data may be grouped according to their size. For example, the time data may be grouped in order of time required to reach a breakdown voltage from short to long.

In operation S130, the distribution may be estimated for each group. The time data included in each group may be matched to a probability distribution to extract parameters. The probability distribution may be a preset probability distribution. The probability distribution may include a Weibull distribution. If the probability distribution is a Weibull distribution, scale parameters and shape parameters may be extracted. The scale parameters may refer to 63.2 percentile of data following a Weibull distribution, and the shape parameters may represent process variation. The greater the process variation of time data of each group is the smaller values of shape parameters may be.

In operation S140, by using at least one quality index calculated in operation S100, the time data of each group may be redistributed. In some example embodiments, at least one quality index may be calculated after operation S130. In each group, the time data selected based on the quality index may be redistributed to another group. The redistribution method will be further described in detail in FIG. 10.

In operation S150, the time data included in each group to which they are redistributed are matched to a desired (or alternatively predetermined) probability distribution, and likelihoods may be calculated. The probability distribution may be the same probability distribution in operation S130. The probability distribution may include a Weibull distribution. When the probability distribution is a Weibull distribution, scale parameters and shape parameters may be extracted. The likelihood may refer to a possibility that the time data selected based on the quality index may be found in the distribution of each redistribution group.

In operation S160, the redistribution result and the likelihood may be stored. The redistribution result may include the redistribution groups and the distribution resulting from matching the redistribution groups to the probability distribution.

In operation S170, it may be confirmed whether all redistribution results have been secured. All redistribution results may refer to the case where when operations S140, S150 and S160 are repeated, a redistribution result derived therefrom overlaps any one of redistribution results that have already been derived. For example, operations S140, S150, and S160 may be repeated until the result of moving the time data overlaps at least one of the results that have already been derived. When all redistribution results are secured, operation S180 is performed, and if not, operations S140, S150, and S160 may be repeated. For example, operations S140, S150, and S160 may be repeated until the results derived from repeating operations S140, S150, and S160 do not overlap the results that have already been derived.

In operation S180, defects in a semiconductor device may be analyzed by using a redistribution result having the highest likelihood among the stored likelihoods. The redistribution result having the highest likelihood among the stored likelihoods may be returned to the system. Accordingly, the system may analyze defects in a semiconductor device by using the redistribution result having the highest likelihood among the stored likelihoods.

Figures 15, 16:
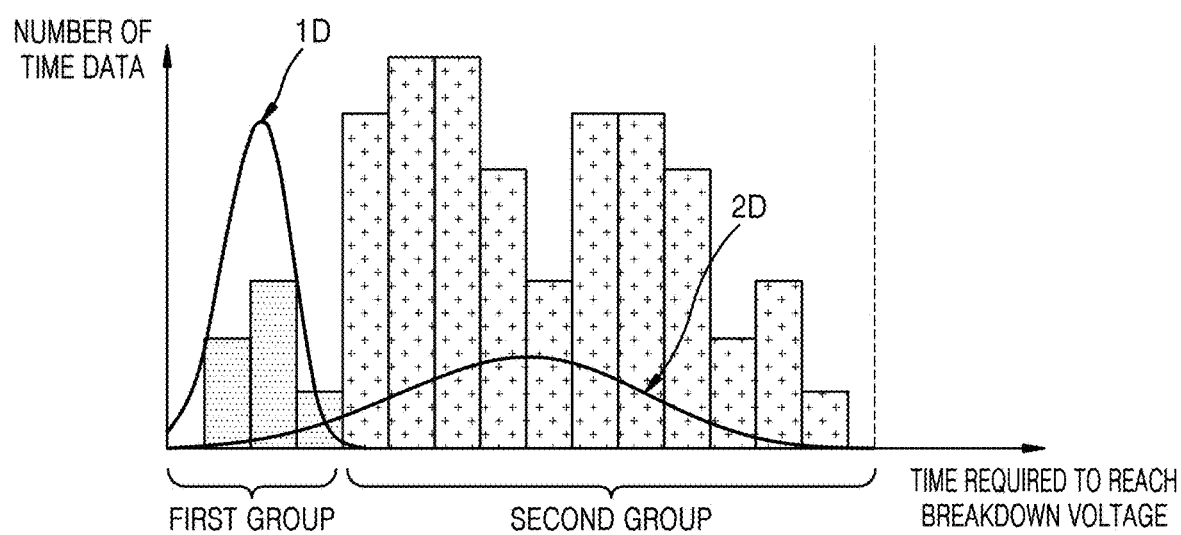
FIG. 15 is a diagram illustrating characteristic values of a first group and a second group according to some example embodiments.
FIG. 16 is a graph showing a distribution according to the number of time data of a first group and a second group according to some example embodiments.

FIG. 14 is a flowchart illustrating operation S140 of FIG. 13. FIG. 15 is a diagram illustrating characteristic values of a first group and a second group, and FIG. 16 is a graph showing distribution according to the number of time data of the first group and the second group of FIG. 15. Operation S100 of FIG. 14 may be the same operation as operation S100 of FIG. 13. Accordingly, redundant descriptions with that of FIG. 13 are omitted. FIG. 13 describes calculating a quality index in operation S100; however, the quality index may be calculated in operation S141 in another embodiment. In some example embodiments, the quality index may be calculated according to the methods of FIGS. 2 to 3. In some example embodiments, operation S140 of FIG. 13 may include operations S141 to S148 of FIG. 14.

In operation S141, characteristic values of each TEG may be calculated by using at least one precalculated quality index. The characteristic values may be criteria for redistributing the time data included in the groups. The characteristic values may be calculated by combining the quality indexes. For example, the characteristic values may be calculated by a weighted sum of the quality indexes. Alternatively, the characteristic values may be calculated, for example, by a weighted average of the quality indexes. For example, the characteristic value may be obtained according to the following Equation 7.

$$S_i = \alpha \times S_{FN,i} + ([\alpha-1]1-\alpha) \times J_{TA,i}$$ [Equation 7]

In Equation 7, $S_i$ may represent a characteristic value of the $i^{th}$ semiconductor device, and $\alpha$ may represent a weight of a quality index (wherein $0 \leq \alpha \leq 1$). $S_{FN,i}$ may represent a first quality index of the $i^{th}$ semiconductor device, and $S_{TA,i}$ may represent a second quality index of the $i^{th}$ semiconductor device. Each of the plurality of TEGs may have a corresponding characteristic value. Accordingly, each group, which has been grouped in operation S120 of FIG. 13, may have a plurality of characteristic values corresponding to each TEG having the time data included in each group.

In operation S142, a minimum value and a maximum value may be extracted from a plurality of characteristic values included in each group. With reference to FIG. 15, for example, the first group may have example values of 0.7, 1, 1.2, 1.5, 2, and 4, and the second group may have example values of 3, 5, 6, 7, 8, and 10. In this case, the minimum value of the first group may be extracted as 0.7, and the maximum value may be extracted as 4. The minimum value of the second group may be extracted as 3, and the maximum value may be extracted as 10.

In operation S143, j may be set as 1 and may represent a group having $j^{th}$ smallest average value of time data among a plurality of groups. For example, when j=1, this may indicate a group having the smallest average value of time data among a plurality of groups. For example, when j is equal to the number of groups set in operation S110; this may indicate a group having the largest average value of time data among a plurality of groups. Though illustrated as j=1, j may be 1 and/or an integer less than or equal to the number of groups. For example, with reference to FIG. 16, the first group may be a group having the first smallest average value of time data among the plurality of groups, and the second group may be a group having the second smallest average value of time data among the plurality of groups.

In operation S144, as to at least one group having an average value less than an average value of time data of a $j^{th}$ group, a characteristic value greater than a minimum value of characteristic value of the $j^{th}$ group may be selected. Also, as to at least one group having an average value of time data greater than an average value of time data of the $j^{th}$ group, a characteristic value less than a maximum value of the characteristic value of the $j^{th}$ group may be selected. The selected characteristic value may become qualified to be moved to another group. For example, with reference to FIG. 15, an average value of time data of a first group may be less than an average value of time data of the second group. Therefore, it may be checked whether first group has a greater characteristic value than the minimum value of the characteristic value of the second group (e.g., 3 in FIG. 15). In FIG. 15, the first group has the example value '4,' which is greater value than '3' which is the minimum value of characteristic value of the second group, so the example value '4' may be selected. Accordingly, the example value of the first group '4' may become qualified to be redistributed to another group (e.g., the second group).

In operation S145, a probability that the time data of TEG having a selected characteristic value is redistributed to the $j^{th}$ group may be calculated. The redistribution probability may be calculated based on a probability that the time data of TEG having the selected characteristic value is found in the $j^{th}$ group. The redistribution probability may be calculated according to the following Equation 8.

$$P_{i,j} = \frac{\pi_j \times p^j(i)}{\sum_{j=1}^{k} \pi_j \times p^j(i)} \quad \text{[Equation 8]}$$

In Equation 8, $\pi_j$ may represent a weight calculated according to the number of time data included in each group. Thus, $\Sigma_{j=1}^{k}\pi_j=1$, and k may represent the number of groups. $P^j(i)$ may represent a probability that the $i^{th}$ time data is found in the $j^{th}$ group, and may be calculated by parameters extracted in operation S130 of FIG. 13.

With reference to FIG. 16, the distribution of time data of the first group may be shown as 1D, and the distribution of time data of the second group may be shown as 2D. The number of time data on the vertical axis may be identical to the number of TEGs. When a probability that the characteristic value (e.g., '4' in FIG. 15) has become qualified to move to another group is found in the distribution 2D of the second group, redistribution may be performed. Therefore, a probability that the time data of TEG having the example value of '4' according to Equation 8 is redistributed to the second group may be calculated.

In operation S146, based on the probability calculated according to operation S415, the time data of TEG having a characteristic value selected in operation S144 may be moved to the $j^{th}$ group. As the characteristic value may represent quality characteristics of a semiconductor device, types of defects may be categorized by redistributing the time data based on the characteristic value.

In operations S147 and S148, j may be increased. When j is greater than the number of groups, operation S150 may be performed. Operation S150 may be the same operation as operation S150 of FIG. 13. Accordingly, operation S160 may be followed according to FIG. 13.

According to some example embodiments, types of defects may be accurately categorized by grouping the time data and redistributing them according to characteristic values representing quality characteristics of a semiconductor device. By analyzing the types of defects accurately, the predictability regarding defects in a semiconductor device may be enhanced. Accordingly, the lifetime of a semiconductor product may be accurately estimated, and thus, customers may be provided with reliability-certified products. For example, if the estimated lifetime of the semiconductor product is determined to be less than an acceptable value, the semiconductor product may be removed from the production stream. In some example embodiments, if the lifetime of a plurality of semiconductor products, using the same and/or equivalent designs, is consistently estimated to be lower than the acceptable value, then a characteristic of the semiconductor product (e.g., an effective mass, material and/or thickness of the dielectric may be adjusted and/or the rated operational charge for the semiconductor product may be adjusted accordingly). In some embodiments, the estimated lifetime may be used to assign the semiconductor product a grade.

Figure 17:
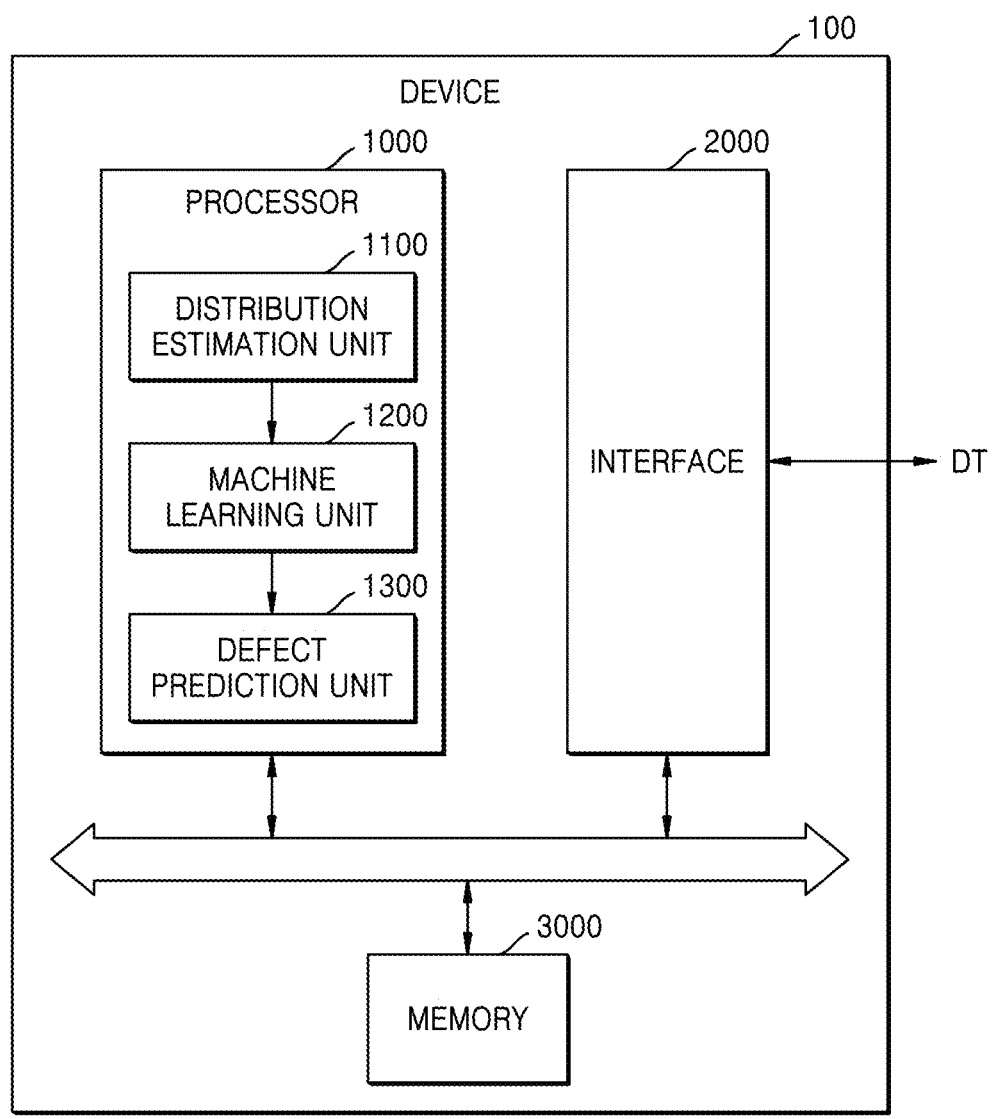
FIG. 17 is a block diagram illustrating a device for analyzing defects in a semiconductor device, according to some example embodiments.

FIG. 17 is a block diagram illustrating a device for analyzing defects in a semiconductor device, according to some example embodiments.

With reference to FIG. 17, the device for analyzing defects in a semiconductor device 100 may include a processor 1000, an interface 2000, and a memory 3000. The processor 1000 may transmit and receive data DT with an external device through the interface 2000. For example, the processor 1000 may load data received from the interface 2000 and data stored in the memory 3000 to predict a defective wafer.

The processor 1000 according to an example embodiment may be configured to execute computer-readable instructions such that the processor 1000 acts as a special purpose processor that implements the operations of a distribution estimation unit 1100, a machine-learning unit 1200, and/or a defect prediction unit 1300. The computer-readable instructions may be stored in memory (e.g., memory 3000 and/or memory (not shown) contained in the processor 1000).

The distribution estimation unit 1100 may output a preset probability distribution corresponding to a distribution of the time data. In some embodiments, the time data may be divided into a plurality of distributions based on how well the distribution of the time data fits the preset probability distribution, and output a preset probability distribution corresponding to each of the plurality of distributions. In some embodiments, a distribution result having the highest likelihood derived from operation S180 of FIG. 13 may be returned to the distribution estimation unit 1100.

The machine learning unit 1200 may receive distribution estimation results from the distribution estimation unit 1100 and generate a semiconductor device defect analysis model based on the received distribution estimation results. The machine learning unit 1200 may include and/or operate based on an artificial intelligence architecture system, a neural network, and/or a machine learning model. For example, the machine learning unit 1200 may include and/or operated based on a convolution neural network (CNN), recurrent neural network (RNN), deep belief network, restricted Boltzmann machine, linear and/or logistic regression, statistical clustering, Bayesian classification, decision trees, dimensionality reduction (such as principal component analysis, and expert systems), and/or combinations thereof, (including ensembles such as random forests), but is not limited thereto.

The defect prediction unit 1300 may receive distribution estimation results from the distribution estimation unit 1100 to classify types of defect distribution, and predict defects in a semiconductor device based on the classified types of defect distribution. For example, the defect prediction unit 1300 may output semiconductor device defect analysis information predicted based on at least one of total life and initial failure rate according to the defect distribution types. Further, the defect prediction unit 1300 may predict an initial failure rate from a new data input by using a model which predicts defects in a semiconductor device, generated from the machine learning unit 1200.

The processor 1000 may further include a grade classification unit (not explicitly shown in the drawings). The grade classification unit may classify grades of a semiconductor device based on defect information output from the defect prediction unit 1300.

The memory 3000 may store various data necessary for the operation of the processor 1000. The memory 3000 may be implemented as, for example, dynamic random access memory (DRAM), mobile DRAM, static RAM (SRAM), phase change RAM (PRAM), Ferroelectric RAM (FRAM), resistive RAM (RRAM or ReRAM) and/or magnetic RAM (MRAM).

While the inventive concepts have been particularly shown and described with reference to embodiments thereof, it will be understood that various changes in form and details may be made therein without departing from the spirit and scope of the following claims.

What is claimed is:

1. A method of analyzing defects in a semiconductor device, the method comprising:
    collecting current data by applying a test voltage to the semiconductor device;
    extracting data within a decrease range from the current data;
    dividing the current data into a first component value and a second component value using the current data and the data extracted from within the decrease range;
    calculating a first quality index from the first component value satisfying a first function; and
    calculating a second quality index from the second component value satisfying a second function that is different from the first function.

2. The method of claim 1, wherein the dividing of the current data into the first component value and the second component value is repeated until an amount of change in the first quality index is less than a first constant value and an amount of change in the second quality index is less than a second constant value.

3. The method of claim 1, wherein the dividing of the current data into the first component value and the second component value comprises:
    extracting a first current value by fitting the data within the decrease range to the first function;
    extracting data by excluding the first current value from the current data; and
    fitting the data extracted by excluding the first current value to the second function to extract a second current value.

4. The method of claim 3, further comprising:
    extracting data, after the extracting of the second current value, by excluding a $2n^{th}$ current value from the current data;
    fitting the data extracted by excluding the $2n^{th}$ current value to the first function to extract a $2n+1^{th}$ current value;
    extracting data by excluding the $2n+1^{th}$ current value from the current data; and
    fitting the data extracted by excluding the $2n+1^{th}$ current value to the second function to extract a $2n+2^{th}$ current value,
    wherein the extracting of the $2n+1^{th}$ current value and the $2n+2^{th}$ current value is repeated until an amount of change in a coefficient of the first function is less than a first constant value and an amount of change in a coefficient of the second function is less than a second constant value, and
    wherein n is an integer greater than or equal to 1 and increased by 1 for every extraction repetition.

5. The method of claim 3, wherein
    the first function relates to a rate of change in an electric field, and
    the second function relates to a trap density.

6. The method of claim 1, wherein
    the first quality index varies according to Fowler Nordheim (FN) tunneling effects on the current data, and
    the second quality index varies according to trap assisted (TA) tunneling effects on the current data.

7. A method of analyzing defects in a plurality of semiconductor devices, the method comprising:
    by applying a test voltage to a plurality of semiconductor devices, collecting current data based on the test voltage and time data based on a breakdown voltage of the plurality of semiconductor devices;
    dividing the time data into a plurality of groups;
    matching a probability distribution to a distribution of each of the plurality of groups; and
    redistributing the time data of the groups based on the current data.

8. The method of claim 7, wherein
    the number of groups is based on a number of types of defects in the plurality of semiconductor devices, and
    the plurality of groups are divided according to a size of the time data.

9. The method of claim 7, wherein the probability distribution is a Weibull distribution.

10. The method of claim 7, wherein the redistributing of the time data comprises:
    calculating characteristic values of each semiconductor device based on the current data of respective semiconductor devices;
    extracting a minimum value and a maximum value of the characteristic values for respective groups of the plurality of groups;
    selecting a characteristic value to be redistributed using the minimum value and the maximum value;
    redistributing time data of at least one semiconductor device, of the plurality of semiconductors, having the selected characteristic value;
    matching the probability distribution to each distribution of the redistributed time data, and calculating a likelihood; and
    storing the likelihood and redistribution results.

11. The method of claim 10, further comprising:
calculating, before the dividing the time data into the plurality of groups, a first quality index that changes according to Fowler Nordheim (FN) tunneling effects on the current data, and a second quality index that changes according to trap assisted (TA) tunneling effects on the current data,
wherein the calculating of the characteristic values comprises combining the first quality index with the second quality index.

12. The method of claim 10, wherein the redistributing of the time data comprises:
selecting, for a group of the plurality of groups, a characteristic value that is greater than the minimum value of a $j^{th}$ group when an average value of the time data for the group is less than an average value of the time data of the $j^{th}$ group or selecting, for the group of the plurality of groups, the characteristic value that is less than the maximum value of the $j^{th}$ group when the average value of the time data for the group is greater than the average value of the time data of the $j^{th}$ group;
calculating a redistribution probability that time data of a semiconductor device having the selected characteristic value is redistributed to the $j^{th}$ group; and
moving the time data of the semiconductor device having the selected characteristic value to the $j^{th}$ group based on the redistribution probability,
wherein j is an integer greater than or equal to 1, and less than or equal to a number of groups.

13. The method of claim 10, further comprising:
repeating the redistributing of the time data; and
analyzing defects in a semiconductor device using a redistribution result with a highest likelihood among all likelihoods,
wherein the repeating is performed until a result of redistributing the time data overlaps any one of the retribution results that have already been derived.

14. The method of claim 7, further comprising:
extracting data within a decrease range from the current data of each semiconductor device and fitting the data extracted within the decrease range to a first function to extract a first current value;
extracting data by excluding the first current value from the current data and fitting the data extracted by excluding the first current value to a second function to extract a second current value;
extracting data by excluding a $2n^{th}$ current value from the current data and fitting the extracted data extracted by excluding the $2n^{th}$ current value to the first function to extract a $2n+1^{th}$ current value; and
extracting data by excluding the $2n+1^{th}$ current value from the current data and fitting the data extracted by excluding the $2n+1^{th}$ current value to the second function to extract a $2n+2^{th}$ current value,
wherein the extracting of the $2n+1^{th}$ current value and the $2n+2^{th}$ current value is repeated until an amount of change in a coefficient of the first function is less than a first constant value, and an amount of change in a coefficient of the second function is less than a second constant value, and
wherein n is an integer greater than or equal to 1 and increased by 1 for every extraction repetition, and
wherein, when the amount of change in the coefficient of the first function is less than the first constant value, the coefficient of the first function is determined as a first quality index, and when the amount of change in the coefficient of the second function is less than the second constant value, the coefficient of the second function is determined as a second quality index.

15. The method of claim 14, wherein
the first function relates to a rate of change in an electric field, and
the second function relates to a trap density.

16. A method of analyzing defects in a semiconductor device, the method comprising:
by applying a test voltage to a plurality of test element groups (TEGs), collecting current data based on the test voltage and time data based on a breakdown voltage of the TEGs;
dividing the current data into a first component value and a second component value using the current data of each TEG and a decrease range of the current data of each TEG;
calculating a first quality index from the first component value satisfying a first function;
calculating a second quality index from the second component value satisfying a second function that is different from the first function;
dividing the time data into a plurality of groups and matching a Weibull distribution to distributions of respective groups of the plurality of groups;
calculating characteristic values of the respective groups using the first quality index and the second quality index;
redistributing the time data using the characteristic values;
matching a Weibull distribution to each distribution of the redistributed time data, and calculating a likelihood; and
storing redistribution results of the time data and the likelihood.

17. The method of claim 16, wherein the redistributing of the time data comprises:
extracting a minimum value and a maximum value of the characteristic values for the respective groups;
selecting, for a group of the plurality of groups, a characteristic value that is greater than the minimum value of a $j^{th}$ group when an average value of the time data for the group is less than an average value of the time data of the $j^{th}$ group, or selecting, for the group of the plurality of groups, the characteristic value that is less than the maximum value of the $j^{th}$ group when the average value of the time data for the group is greater than the average value of the time data of the $j^{th}$ group, a characteristic value;
calculating a probability that the time data of each TEG having the selected characteristic values is redistributed to the $j^{th}$ group; and
moving the time data of the respective TEGs having the selected characteristic values to the $j^{th}$ group based on to the redistribution probability,
wherein j is an integer greater than or equal to 1, and less than or equal to a number of groups.

18. The method of claim 16, wherein
the first quality index varies based on Fowler Nordheim (FN) tunneling effects on the current data,
the second quality index varies based on Trap Assisted (TA) tunneling effects on the current data, and
the characteristic values are calculated by combining the first quality index with the second quality index.

19. The method of claim 16, further comprising:
repeating the calculating of the characteristic values and redistributing of the time data using the characteristic values, the matching of a Weibull distribution to each distribution of the respective redistributed time data, the calculating of a likelihood, and the storing of the likelihood and redistribution results of the time data; and analyzing defects in the TEG based on a redistribution result with a highest likelihood among all likelihoods, wherein the repeating is performed until the redistribution result overlaps any one of the retribution results that have already been derived.

20. The method of claim 16, wherein the dividing of the current data into the first component value and the second component value comprises:

extracting a first current value by fitting the decrease range of the current data to the first function;

extracting data by excluding the first current value from the current data and fitting the data extracted by the first current value to the second function to extract a second current value;

extracting data by excluding a $2n^{th}$ current value from the current data and fitting the data extracted by the $2n^{th}$ current value to the first function to extract a $2n+1^{th}$ current value; and extracting data by excluding the $2n+1^{th}$ current value from the current data and fitting the data extracted by the $2n+1^{th}$ current value to the second function to extract a $2n+2^{th}$ current value, wherein the extracting of the $2n+1^{th}$ current value and the $2n+2^{th}$ current value is repeated until an amount of change in a coefficient of the first function is less than a first constant value, an amount of change in a coefficient of the second function is less than a second constant value, wherein n is an integer greater than or equal to 1 and increased by 1 for every extraction repetition, and wherein the calculating of the first quality index and the second quality index comprises determining the coefficient of the first function as the first quality index when the amount of change in the coefficient of the first function is less than the first constant value, and, determining the coefficient of the second function as the second quality index when the amount of change in the coefficient of the second function is less than the second constant value.

* * * * *